(12) United States Patent
Barak

(10) Patent No.: US 6,400,930 B1
(45) Date of Patent: Jun. 4, 2002

(54) FREQUENCY TUNING FOR RADIO TRANSCEIVERS

(75) Inventor: Elen Shaul Barak, Kfar Sava (IL)

(73) Assignee: DSPC Israel, Ltd., Gival Shmuel (IL)

( * ) Notice: Subject to any disclaimer, the term of this patent is extended or adjusted under 35 U.S.C. 154(b) by 0 days.

(21) Appl. No.: 09/187,840

(22) Filed: Nov. 6, 1998

(51) Int. Cl.[7] .............................. H04B 1/40; H04B 1/18
(52) U.S. Cl. ...................... 455/76; 455/182.2; 375/149
(58) Field of Search ................................ 455/75–77, 84, 455/119, 120, 123, 125, 182.2, 182.3, 183.1, 183.2, 184.1, 192.3; 375/376, 149, 344; 327/105; 390/514

(56) References Cited

U.S. PATENT DOCUMENTS

| | | | |
|---|---|---|---|
| 3,938,316 A | | 2/1976 | Morokawa et al. |
| 4,015,208 A | | 3/1977 | Hammer et al. |
| 4,093,873 A | | 6/1978 | Vannier et al. |
| 4,454,483 A | | 6/1984 | Baylor |
| 5,319,680 A | * | 6/1994 | Port et al. ..................... 375/375 |
| 5,375,146 A | | 12/1994 | Chalmers |
| 5,382,921 A | * | 1/1995 | Estrada et al. ............... 331/1 A |
| 5,390,348 A | * | 2/1995 | Magin et al. ............. 455/182.2 |
| 5,485,490 A | * | 1/1996 | Leung et al. ................ 375/371 |
| 5,517,678 A | | 5/1996 | Klank et al. |
| 5,535,441 A | * | 7/1996 | Jackson et al. .......... 455/182.2 |
| 5,552,838 A | | 9/1996 | Suizu |
| 5,604,468 A | | 2/1997 | Gillig |
| 5,640,427 A | | 6/1997 | Rainish ....................... 375/329 |
| 5,754,595 A | * | 5/1998 | Honkasalo et al. .......... 375/286 |
| 6,222,874 B1 | * | 4/2001 | Walley et al. ............... 375/149 |

FOREIGN PATENT DOCUMENTS

| | | |
|---|---|---|
| EP | 2 320 628 | 6/1998 |
| EP | 0 946 010 | 9/1999 |
| WO | WO 97/ 44898 | 11/1997 |

* cited by examiner

Primary Examiner—Tracy Legree
(74) Attorney, Agent, or Firm—Welsh & Katz, Ltd.

(57) ABSTRACT

A radio communication device, which transmits or receives a signal at a predetermined carrier frequency. The device includes a reference oscillator, which generates a clock frequency having a clock frequency error relative to a specified frequency thereof, a processor, which estimates the clock frequency error and parses the error to determine coarse and fine error correction components, at least one frequency synthesizer, which responsive to the clock frequency and to the coarse error correction component, generates a partially corrected frequency having a residual frequency error, which partially corrected frequency is applied to process the signal and baseband processing circuitry, which applies the fine error correction component to process the signal so as to correct the residual frequency error.

39 Claims, 4 Drawing Sheets

FREQUENCY TUNING FOR RADIO TRANSCEIVERS

FIELD OF THE INVENTION

The present invention relates generally to radio communication devices, and specifically to devices and methods for accurate frequency control of radio transceivers.

BACKGROUND OF THE INVENTION

Radio transceivers used in mobile communication require stable clock sources and frequency synthesizers for use in modulation and demodulation of RF signals. The frequency synthesizers must be capable of tuning and locking onto a base station frequency with high accuracy. In a typical cellular communications system, for example, a radio transceiver must typically be capable of initial tuning, based on dead reckoning to an accuracy of 2 ppm, and then once a base station signal is detected, locking onto the signal frequency to an accuracy of 0.2 ppm. In the 800 MHz cellular band, these requirements translate into 1.6 kHz initial tuning accuracy and 160 Hz locking accuracy. In the 1.5 GHz band, the figures are roughly double.

Crystal oscillators, which are commonly used for frequency control in radio transceivers and other applications, are not in themselves sufficiently stable to provide the levels of accuracy noted above. The inherent frequency of the crystal oscillator is known to vary with temperature and also to change gradually as the crystal ages. A typical crystal oscillator, for example, a PXO-type oscillator, produced by Telequarz of Neckarbischofsheim, Germany, has a frequency accuracy of ±10 ppm. The long-term drift of the frequency of the crystal with age is about 2 ppm per year.

Because of these shortcomings of ordinary crystal oscillators, transceivers known in the art generally use either a temperature-compensated crystal oscillator (TCXO) or a voltage-controlled TCXO (VCTCXO) as a precise frequency reference source. Temperature-compensated oscillators are described, for example, in U.S. Pat. Nos. 3,938,316, 4,015,208, 4,454,483, 5,375,146 and 5,604,468, which are incorporated herein by reference. The TCXO or VCTCXO receives an indication of the ambient temperature and corrects the oscillator output frequency accordingly, so as to compensate for the known characteristic temperature variation of the crystal frequency.

TCXOs and VCTCXOs are larger and heavier than simple crystal oscillators and include elements that are not easily incorporated in monolithic transceiver devices. They also depend on the use of a crystal which has a high motional capacitance to allow for externally-controlled tuning of the oscillator, and is therefore larger than standard crystals used in simple crystal oscillators. Therefore, TCXOs and VCTCXOs add undesirably to the cost and weight of RF communication devices, such as cellular telephones, in which they are used.

SUMMARY OF THE INVENTION

It is an object of some aspects of the present invention to provide methods and devices enabling accurate tuning of a radio transceiver using a low-cost frequency reference source.

It is a further object of some aspects of the present invention to provide an accurate radio frequency source that can readily be incorporated in a monolithic transceiver device.

It is yet another object of some aspects of the present invention to provide an accurate radio frequency source that does not require a TCXO or a VCTCXO.

In preferred embodiments of the present invention, a radio transceiver, which communicates with a base station on a base station carrier frequency, comprises one or more frequency synthesizers, which receive clock signals from a reference oscillator. Preferably, the reference oscillator comprises a simple crystal oscillator without temperature compensation or means for external frequency control. A frequency error of the clock signals relative to a clock frequency required by the radio transceiver is estimated based on the error it causes in the frequency of the transceiver. The estimated error is parsed into a coarse correction estimate and a fine correction estimate. The coarse correction is applied to step one or more of the frequency synthesizers, so that the synthesizers generate frequency signals within a predetermined range of a target frequency. The fine correction is applied by generating a corresponding frequency correction in a correction circuit of the transceiver, preferably in baseband circuitry of the transceiver. By parsing the frequency error and thus applying frequency corrections cooperatively in the synthesizers and the baseband circuitry, the present invention enables the transceiver to tune and lock onto the carrier frequency with high accuracy, while maintaining a fast time response and low noise level, without the need for a temperature-compensated or voltage-controlled oscillator.

In some preferred embodiments of the present invention, additional information is input to the transceiver regarding physical conditions of the crystal oscillator. This information preferably includes the temperature and age of the crystal, as well as predicted or recorded data regarding the response of the crystal oscillator to the physical conditions. The information may also include the oscillator supply voltage and load, as well as any other parameters affecting the performance of the oscillator. The information is used in dead reckoning of the frequency error, which is applied in initial tuning of the transceiver. Thereafter, a closed-loop measurement of the error is preferably made, and the measured error is parsed into a coarse frequency error and a fine residual error and is used in fine-tuning the synthesizers and baseband circuitry.

In some preferred embodiments of the present invention, the frequency correction of the baseband signals is performed by shifting the phase of the signals, most preferably by subtracting the residual frequency error after demodulation of intermediate frequency (IF) signals. Alternatively or additionally, the residual frequency error is corrected by multiplication of the modulated IF signals by a phasor, either in digital or analog form, using a complex multiplier. The phasor applies to the signals a phase shift that varies continuously with time, in a manner calculated to generate the desired frequency correction.

Further alternatively or additionally, the residual frequency error is accounted for during generation of the signals (in transmission) and/or in determination of the values of the signals (in reception), preferably at the stage of modulation and/or demodulation of the signals. For example, in a system utilizing FSK modulation, in which the demodulation is performed by a frequency discriminator, the decision threshold level is adjusted responsive to the residual frequency error. During transmission, the transceiver generates modulating tones at a frequency that differs from the designed frequency by an amount necessary to account for the residual error.

There is therefore provided in accordance with a preferred embodiment of the present invention, a radio communication device, which transmits or receives a signal at a predetermined carrier frequency, including a reference oscillator, which generates a clock frequency having a clock frequency error relative to a specified frequency thereof, a processor, which estimates the clock frequency error and parses the error to determine coarse and fine error correction components, at least one frequency synthesizer, which responsive to the clock frequency and to the coarse error correction component, generates a partially corrected frequency having a residual frequency error, which partially corrected frequency is applied to process the signal, and signal processing circuitry, which applies the fine error correction component to process the signal so as to correct the residual frequency error.

Preferably, the reference oscillator includes a crystal oscillator which is not a temperature-compensated crystal oscillator.

Preferably, the reference oscillator does not receive a control input for adjustment of the clock frequency.

Preferably, the processor estimates the clock frequency error responsive to a known operating characteristic of the reference oscillator.

Preferably, the device includes a sensor, which makes a measurement of an operating condition of the reference oscillator to which the known operating characteristic is responsive, which measurement is used by the processor in estimating the clock frequency error.

Preferably, the sensor includes a temperature sensor.

Preferably, the known operating characteristic includes a variation of the clock frequency with age of the oscillator.

Preferably, the device includes a memory, which stores data indicative of the response of the clock frequency error to the operating characteristic, which data are used by the processor in estimating the clock frequency error.

Preferably, the processor measures the response of the clock frequency error to the operating characteristic and processes the measured response to generate the data stored in the memory.

Preferably, the at least one frequency synthesizer includes first and second frequency synthesizers, and the processor parses the coarse error correction component into a first correction component applied by the first synthesizer and a second correction component applied by the second synthesizer.

Preferably, the device includes a mixer, which mixes the signal with the first partially corrected frequency to generate a first intermediate-frequency signal, which is mixed with the second partially corrected frequency to generate a second intermediate-frequency signal for input to the signal processing circuitry.

Preferably, the device includes a signal detector, which provides, responsive to the signal, an indication of a frequency error remaining after application of one or more of the error correction components.

Preferably, the signal detector includes a frequency estimator, which counts transitions of the processed signal to determine a frequency estimate thereof.

Preferably, the signal detector includes a phase detector, which detects a phase shift in the signal processed by the signal processing circuitry.

Preferably, the signal processing circuitry comprises baseband circuitry.

Preferably, the baseband circuitry includes a subtractor, which subtracts a time-varying phase value from the signal so as to correct the residual frequency error.

Alternatively, the signal processing circuitry includes a complex multiplier, which applies a time-varying phase shift to the signal so as to correct the residual frequency error.

Preferably, the signal processing circuitry compensates for the residual frequency error in the course of processing information carried by the signal.

Preferably, the signal processing circuitry includes a modulator the settings of which are adjusted by an offset determined responsive to the residual frequency error.

Preferably, the signal processing circuitry includes a demodulator the settings of which are adjusted by an offset determined responsive to the residual frequency error.

Preferably, the at least one synthesizer includes a receiver synthesizer and a transmitter synthesizer generating respective partially corrected frequencies, which are respectively applied to process received and transmitted signals.

There is further provided in accordance with a preferred embodiment of the present invention, a radio communication device, which transmits or receives a signal at a predetermined carrier frequency, including a crystal frequency source, an integrated circuit device including a reference oscillator circuit, which is coupled to the crystal frequency source so as to generate a clock frequency and baseband processing circuitry, which processes the signal, and radio frequency processing circuitry, which responsive to the clock frequency processes the signal cooperatively with the baseband processing circuitry.

Preferably, the radio frequency processing circuitry includes at least one frequency synthesizer, which generates a radio frequency responsive to the clock frequency for use in processing the signal.

Preferably, the clock frequency has a clock frequency error relative to a specified frequency thereof, which is corrected cooperatively by the baseband processing circuitry and the radio frequency processing circuitry.

Preferably, the device does not include a temperature-compensated crystal oscillator.

Preferably, the reference oscillator does not receive a control input for adjustment of the clock frequency.

There is further provided in accordance with a preferred embodiment of the present invention, a method for tuning the frequency of a radio communications device so as to correct for a frequency error of a clock frequency generated by a reference oscillator relative to a specified frequency thereof, including estimating the clock frequency error, parsing the estimated error into a coarse error component and a fine error component, responsive to the coarse error component, generating a partially-corrected frequency having a residual frequency error, applying the partially-corrected frequency to process the signal, and responsive to the fine error component, applying a fine frequency correction so as to correct the residual frequency error.

Preferably, estimating the error includes estimating a frequency deviation responsive to an operating characteristic of the reference oscillator.

Preferably, the method includes making a measurement of an operating condition of the oscillator to which the operating characteristic is responsive, and the error is estimated responsive to the measurement.

Preferably, making the measurement includes measuring a temperature.

Preferably, estimating the error includes estimating a variation of the clock frequency with age of the oscillator.

Preferably, estimating the frequency deviation includes recording and using a record of frequency dependence on the operating characteristic.

Preferably, parsing the error into the coarse component includes parsing the error into initial and intermediate error components, and generating the partially corrected frequency includes generating a first partially corrected frequency responsive to the initial error component and a second partially corrected frequency responsive to the intermediate error component, which first and second partially corrected frequencies are applied in processing the signal.

Preferably, applying the partially corrected frequency includes mixing the signal with the first partially corrected frequency to generate a first intermediate-frequency signal, which is mixed with the second partially corrected frequency to generate a second intermediate-frequency signal.

Preferably, estimating the error includes determining, responsive to the signal, an estimate of a frequency error remaining after processing the signal.

Preferably, determining the estimate includes measuring a frequency of a processed signal after application of the partially-corrected frequency thereto.

Preferably, measuring the frequency includes counting transitions in the signal.

Preferably, estimating the error includes detecting a frequency deviation in baseband processing of the signal.

Preferably, detecting the frequency deviation includes acquiring a synchronization of a signal received by the device and detecting a deviation responsive to the synchronization.

Preferably, estimating and parsing the error include estimating and parsing iteratively and applying the iteratively estimated and parsed error components so as to compensate for the clock frequency error to within a predetermined tolerance.

Preferably, determining the estimate includes estimating a frequency error in processing a received signal, and parsing the error includes parsing the estimated frequency error for application of corrections to a transmitted signal.

Preferably, applying the fine frequency correction includes applying the correction during baseband processing.

Preferably, applying the fine frequency correction includes subtracting the frequency correction.

Alternatively or additionally, applying the fine frequency correction includes applying a time-varying phase shift to the signal.

Preferably, applying the phase shift includes driving a complex multiplier which operates on the signal.

Preferably, applying the fine frequency correction includes compensating for the residual frequency error in the course of processing information carried by the signal.

The present invention will be more fully understood from the following detailed description of the preferred embodiments thereof, taken together with the drawings in which:

DETAILED DESCRIPTION OF PREFERRED EMBODIMENTS

Figure 1:
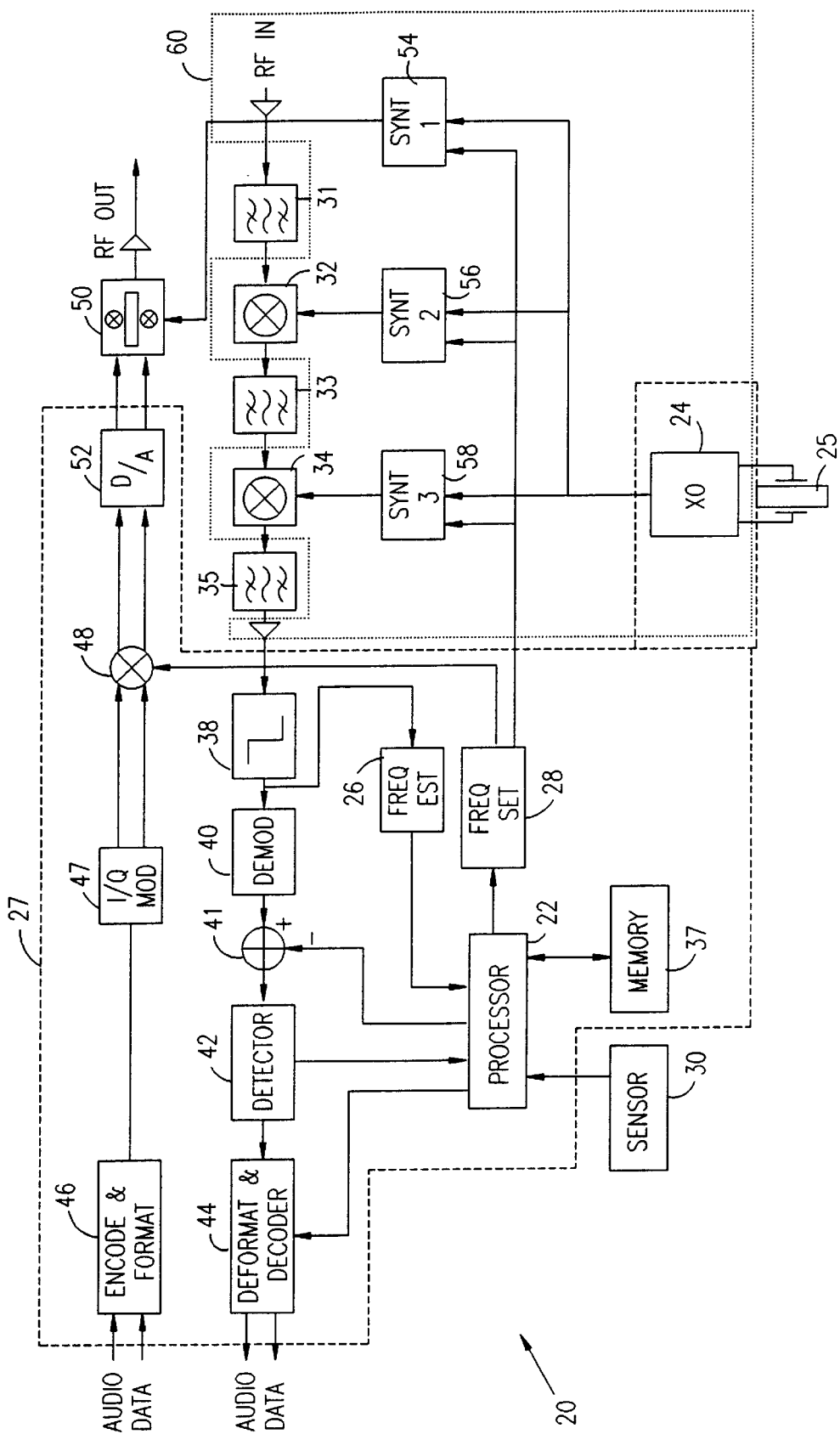
FIG. 1 is a schematic block diagram showing a radio transceiver using a simple crystal oscillator as a frequency source, in accordance with a preferred embodiment of the present invention.

Reference is now made to FIG. 1, which is a schematic block diagram showing elements of a radio transceiver 20, in accordance with a preferred embodiment of the present invention. Transceiver 20 is of a type commonly used in PDC-standard cellular telephones, and is preferably implemented in the form of one or more custom integrated circuit devices, including all or most of the functions of the blocks shown in FIG. 1. It will be appreciated, however, that the principles of the present invention may similarly be applied to transceivers for use in accordance with other cellular communications standards, as well as transmitters, receivers and transceivers of other types.

Transceiver 20 preferably comprises a processor 22, which receives data from various elements of the transceiver and controls various transceiver functions. The processor preferably comprises a digital signal processor or microprocessor core, of any suitable type known in the art. For clarity and simplicity of illustration, only those functional connections that are of importance in understanding the present invention are shown in FIG. 1. Those skilled in the art will be aware of additional functions for which the processor is or can be used. Furthermore, at least some of the blocks shown in FIG. 1 which perform logical functions are preferably implemented using software running on processor 22. Alternatively, the functions of the processor and of some or all of the other blocks shown in the figure may also be implemented using dedicated hardware circuits.

Preferably, the processor and functional elements of transceiver 20 associated therewith are implemented in a single monolithic integrated circuit device, more preferably in two integrated devices, referred to herein as a modem chip 27 and an RF chip 60, both of which are indicated symbolically in FIG. 1 by dashed lines containing the respective elements. It will be understood, however, that many other implementations, using various combinations of discrete and integrated components, are possible.

A crystal oscillator 24 provides a clock signal which is used by transceiver 20, under the control of processor 22, to tune and lock onto a carrier frequency of a base station (not shown) with which the transceiver is in communication. Oscillator 24 does not have its own temperature compensation function or facilities for external control and adjustment of the clock signal frequency. Instead, processor 22 determines an estimated error of the clock signal frequency relative to a reference frequency and parses the estimated error into a coarse component and one or more intermediate and/or fine components.

Responsive to the parsing of the error, a frequency setter 28 issues frequency correction settings to control certain elements of the transceiver and compensate for the error, as described in greater detail hereinbelow. A frequency estimator 26 provides the processor with an improved, closed-loop estimate of the error remaining after the frequency correction settings have been applied, and the processor uses the improved estimate in determining new, more precise settings. Setter 28 and estimator 26, which preferably comprises a zero-crossing counter, are preferably implemented in hardware and/or software on chip 27 together with processor 22 and other modulating, demodulating and baseband processing elements of transceiver 20.

Figure 2:
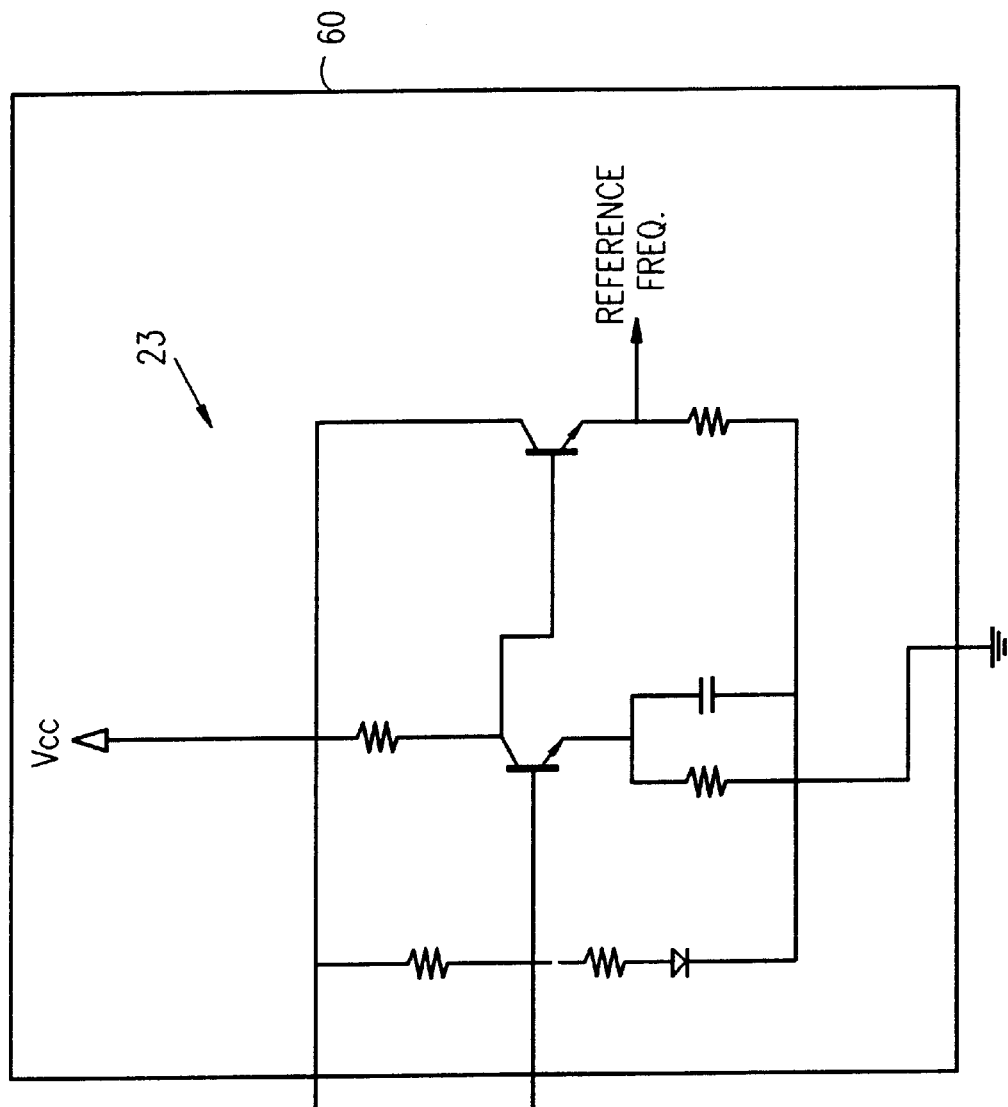
FIG. 2 is a schematic circuit diagram showing an oscillator circuit used in the transceiver of FIG. 1, in accordance with a preferred embodiment of the present invention.
Figure 2:
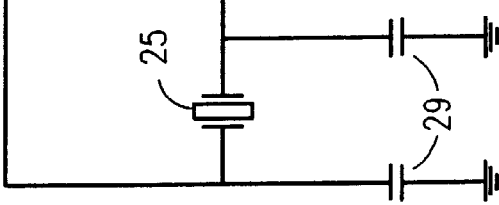

FIG. 2 is a schematic electrical diagram showing details of oscillator 24, in accordance with a preferred embodiment of the present invention. The oscillator comprises a crystal 25, for example, a RSX-2 FDD32 crystal produced by Rakon Ltd., of Auckland, New Zealand, and oscillator circuitry 23. Aside from capacitors 29, which typically have a high capacitance (generally above 10 pF), and a high stability, and are generally not produced as part of an integrated circuit, the remainder of circuitry 23 is preferably entirely contained in chip 60, or alternatively in chip 27 (the dashed lines in FIG. 1 containing circuitry 23 are to be taken in the alternative). Such an integrated design is not practical when a temperature-compensated or voltage-controlled TCXO oscillator is required and is therefore not used in high-precision radio transceivers known in the art. The circuit design shown in FIG. 2 is based on *Crystal Oscillator Circuits,* by Robert J. Matthys (John Wiley & Sons, 1983), page 135, which is incorporated herein by reference. Values of the components of the circuitry are chosen in accordance with the reference frequency for which oscillator 24 is designed, and appropriate choices of the values will be clear to those skilled in the art.

Returning to FIG. 1, in a preferred embodiment of the present invention, a sensor 30, most preferably a temperature sensor, provides an input to processor 22 indicative of the operating conditions of oscillator 24. The processor is coupled to a memory 37, in which data indicative of operating characteristics of the oscillator are stored. These characteristics preferably include the oscillator's temperature response, as well as its frequency drift with age. The processor uses the input from sensor 30 to perform an initial dead reckoning of the frequency error based on the measured temperature and the known age of the oscillator. The data regarding the oscillator's operating characteristics are preferably stored in memory 37 following factory calibration or based on information provided by the manufacturer of oscillator 24 and/or of crystal 25, and may be stored either in the form of a look-up table or as coefficients of an equation applied by the processor in calculating the frequency error. Optionally, the data are determined and stored or updated by the processor itself, by monitoring the frequency error as a function of changing operating characteristics in the field.

Additionally or alternatively, the sensor may comprise a voltage and/or current sensor, and the data stored in memory 37 may include the response of the oscillator to variations in voltage and/or load. Any other characteristics that affect the clock frequency generated by the oscillator may similarly be sensed, stored and used by processor 22 in estimating the frequency error.

Application of the frequency corrections determined by processor 22 will now be described in greater detail with reference to processing of RF signals received and transmitted by transceiver 20. Signals received from the base station are filtered by a RF bandpass filter 31 and are then successively down-converted to intermediate frequencies IF1 and IF2 by mixers 32 and 34, respectively. Down-conversion of the received signals in two IF stages is well known in the art of radio transceivers, in order to meet analog signal processing constraints, and is not essential to the present invention. Those skilled in the art will appreciate that the principals of the present invention may be implemented in transceivers with any number of down-conversion stages. Preferably, for a base station frequency of about 800 MHz (in the PDC cellular band), IF1 is 130 MHz and IF2 is 400 kHz. The IF1 and IF2 signals are respectively filtered by a first IF bandpass filter 33 and a second IF bandpass filter 35, as shown in FIG. 1. Preferably, filter 33 comprises a SAW filter having a bandwidth of ±16 kHz, and filter 34 comprises a ceramic filter with a bandwidth of ±12 kHz.

The down-conversion is performed using local frequency signals provided by synthesizers 56 and 58, respectively, to mixers 32 and 34. The synthesizers receive clock signals from crystal oscillator 24 and correction settings from setter 28, wherein an initial, coarse, correction is applied to synthesizer 56, and a subsequent finer correction is applied to synthesizer 58. Any residual frequency error remaining in IF2 is corrected before or during baseband processing as described hereinbelow.

As noted in the Background of the Invention, the clock frequency of crystal oscillator 24 may be expected to vary initially from its nominal frequency by ±10 ppm plus an additional 2 ppm per year with age. Assuming a five-year life of transceiver 20, the estimated total variation of the frequency with age can be taken to be ±10 ppm. Thus, the total error budget will be about ±20 ppm, so that for a base station frequency in the 800 MHz cellular band, synthesizers 56 and 58 are preferably able to compensate for ±16 kHz of error due to frequency drift.

The frequency generated by synthesizer 56 is in the same frequency band as the base station carrier frequency, which is 800 MHz in the present example. Preferably, setter 28 adjusts the frequency of synthesizer 56 in steps roughly equal to the inter-channel spacing of the base station, i.e., 25 kHz for the PDC cellular standard. Alternatively, the step size may be subdivided by an integer number, to 12.5 kHz, for example, if filter 33 has a bandwidth narrower than the full inter-channel spacing, as in the present preferred embodiment. The step size for synthesizer 56 should not be made too small, however, since that would prolong the time required for setter 28 to step the synthesizer across its tuning range.

Once synthesizer 56 is suitably tuned, setter 28 steps the frequency of synthesizer 58 to correct residual frequency error, based on the estimated frequency of the intermediate frequency IF2 signal provided by estimator 26 to processor 22. Preferably, synthesizer 58 operates at a frequency of 129.9 MHz, which is varied in steps of about 1 kHz until it is optimally tuned.

In preparation for baseband processing, the intermediate frequency IF2 signal is hard-limited by a comparator 38, and the resultant binary signal is then demodulated by a demodulator 40. Assuming that the baseband signals are differentially phase-modulated, as is well known and commonly practiced in the art, the demodulator generates an output proportional to the phase of the signals, which enables a detector 42 to detect and output a value representative of the phase shift of the signals.

Operation of comparator 38, demodulator 40 and detector 42 is described, for example, in U.S. Pat. No. 5,640,427, which is incorporated herein by reference. It will be understood, however, that other baseband processing methods and devices, as are known in the art, may similarly be used for such phase detection.

The remaining residual frequency error not handled by synthesizers 56 and 58, due to their discrete step characteristic, is preferably subtracted from the output of demodulator 40 by a subtractor 41. The phase error subtracted by subtractor 41 is preferably calculated by processor 22 as equal to $2*\Pi*\Delta f*Ts$, wherein $\Delta f$ is the residual frequency error and Ts is the symbol duration, i.e., the time allotted to transmission of each symbol in the received signals. Preferably, subtractor 41 provides a final ±500 Hz of adjustment, so that transceiver 20 locks onto the base station frequency to within the required 0.2 ppm or less.

Figure 3:
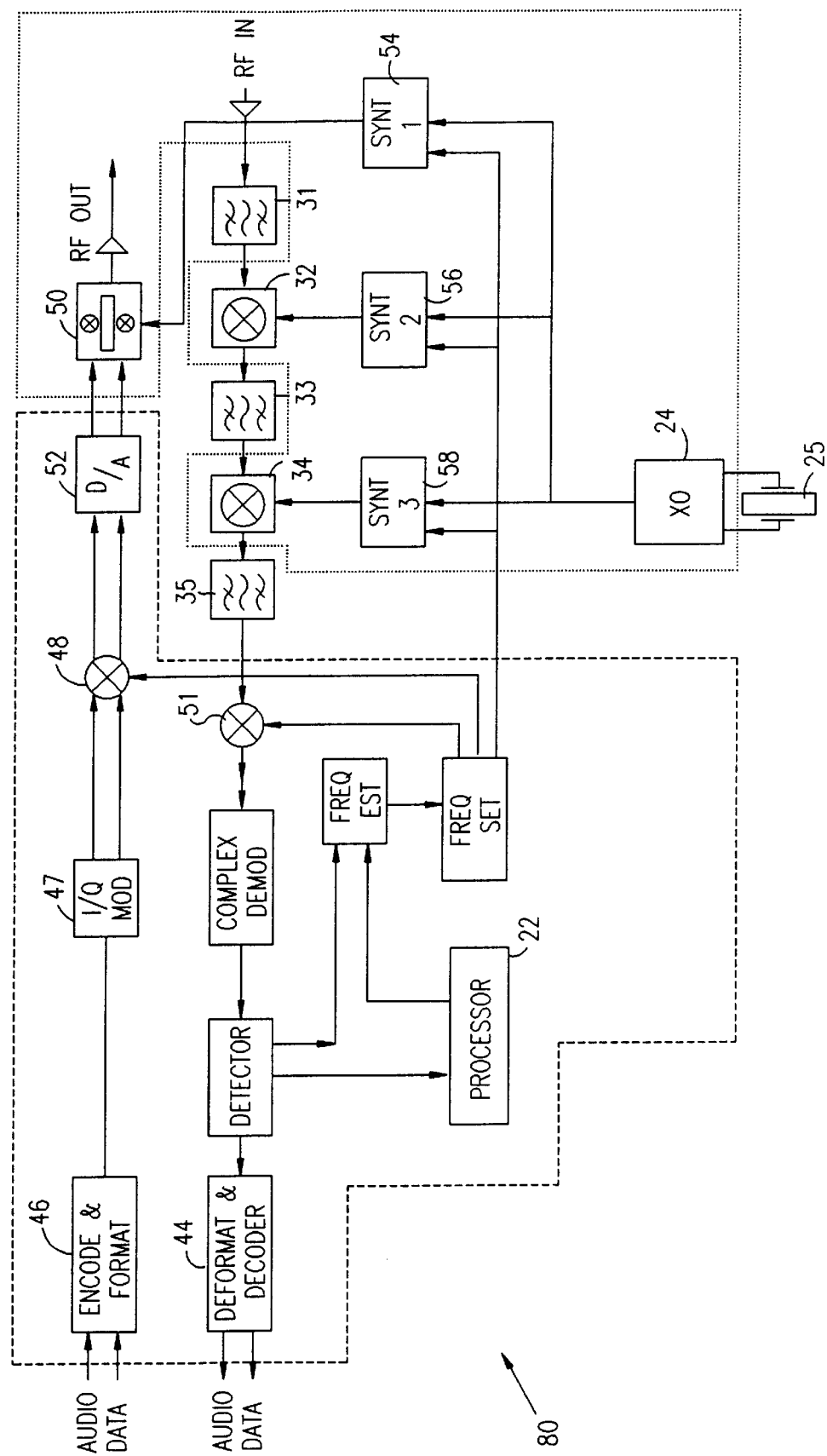
FIG. 3 is a schematic block diagram showing elements of a radio transceiver, in accordance with another preferred embodiment of the present invention.

FIG. 3 is a schematic block diagram showing elements of a linear radio transceiver 80, in accordance with a preferred embodiment of the present invention. Transceiver 80 is similar to transceiver 20 but compensates for the residual frequency error by phase rotation. Preferably, a complex multiplier 51 multiplies the IF signal entering comparator 38 by $\exp(-j*\Delta\phi)$, wherein $\Delta\phi$ is a required time-varying phase shift given by $\Delta\phi=2\pi\Delta f_3*t$, in which $\Delta f_3$ is the residual frequency error to be corrected and t is the time.

Alternatively or additionally, complex multiplier 51 is positioned between synthesizer 58 and mixer 34, between mixer 34 and filter 35, or in any other suitable position. The complex multiplicand multiplying the signals is determined accordingly by setter 28.

Preferably, although not necessarily, transceiver 80 includes a complex demodulator 90 in place of comparator 38 and demodulator 40.

Returning to FIG. 1, the phase detected by detector 42 is fed back to processor 22, which accordingly instructs setter 28 to control subtractor 41 (and possibly synthesizers 56 and 58, as well) so as to correct small frequency deviations remaining after adjustment of synthesizer 58, as described hereinabove. A suitable method for calculating a time-varying phase shift required to correct for such a frequency deviation is described, inter alia, in the above-mentioned U.S. Pat. No. 5,640,427. This method of detecting and correcting frequency deviations takes the place of conventional automatic frequency control (AFC) used for this purpose in transceivers known in the art.

The output of detector 42 is passed to processing circuitry 44, which performs functions such as descrambling, deformatting, and decoding of audio, data and control signals, as are known in the art of cellular communications. Other types of transceivers will involve other processing functions, and the principles of the present invention are not limited to cellular telephony and can be implemented in transceivers of various types.

In an alternative preferred embodiment of the present invention, the remaining residual error is accounted for during demodulation, decoding, and/or detecting the data contents of the signals. For example, when the signals are modulated utilizing FSK modulation, processor 22 adjusts a decision threshold level in circuitry 44 responsive to the residual frequency error, so as to correct for the residual error. Similarly, other methods may be used to handle the remaining residual frequency error depending on the type of modulation used, the demodulation scheme, etc.

In a transmission channel of transceiver 20, outgoing audio, data and control signals are encoded, formatted and scrambled by processing circuitry 46. In accordance with PDC standards, this process is a "mirror image" of that performed by circuitry 44, although the specific nature of the encoding/decoding and formatting/deformatting processes is in no way essential to the present invention. A resulting phase-modulated signal is input to a digital I/Q modulator 47, which separates the signal into I and Q baseband components. These components are phase-shifted by a complex multiplier 48 and converted to analog signals by a digital/analog (D/A) converter 52. The component analog signals are then up-converted by a RF I/Q modulator 50 to generate RF output signals at a transmission frequency furnished by a synthesizer 54.

Frequency correction of the transmitted signals is performed using a method analogous to that applied to the signals received from the base station. Synthesizer 54, which is substantially similar in design and operation to synthesizer 56, receives a clock input from oscillator 24 and a corrected frequency setting from setter 28, so that the frequency that is furnished to I/Q modulator 50 is properly tuned within the ±12.5 kHz bounds described hereinabove. Any residual error in the frequency of the transmitted signal is corrected by time-varying phase rotation at multiplier 48, as described above with reference to complex multiplier 51 (FIG. 3) used for processing received signals. In the preferred embodiment shown in FIG. 1, only a single RF I/Q modulator 50 is used in up-converting the transmitted signals, as is commonly practiced in the radio transceiver art. Therefore, a wider latitude of frequency correction is typically applied to multiplier 48 than need be applied to subtractor 41. The error in the clock frequency generated by oscillator 24, determined in the course of calculating the frequency corrections for processing of the received signals, is preferably used to determine the settings to be applied by setter 28 to synthesizer 54 and multiplier 48.

Alternatively, frequency correction of the transmitted signals is performed using two or more synthesizers, as are used for processing the received signals. Further alternatively, synthesizers 56 and 58 may be used for frequency generation and correction of both transmitted and received signals.

In other preferred embodiments of the present invention, the signals are modulated in modulator 47 or are encoded in processing circuitry 46 with an offset which compensates for the residual frequency error. For example when the signals are FSK-modulated, modulator 47 uses modulating tones at a frequency that differs from a nominal frequency by an amount necessary to account for the residual error.

Figure 4:
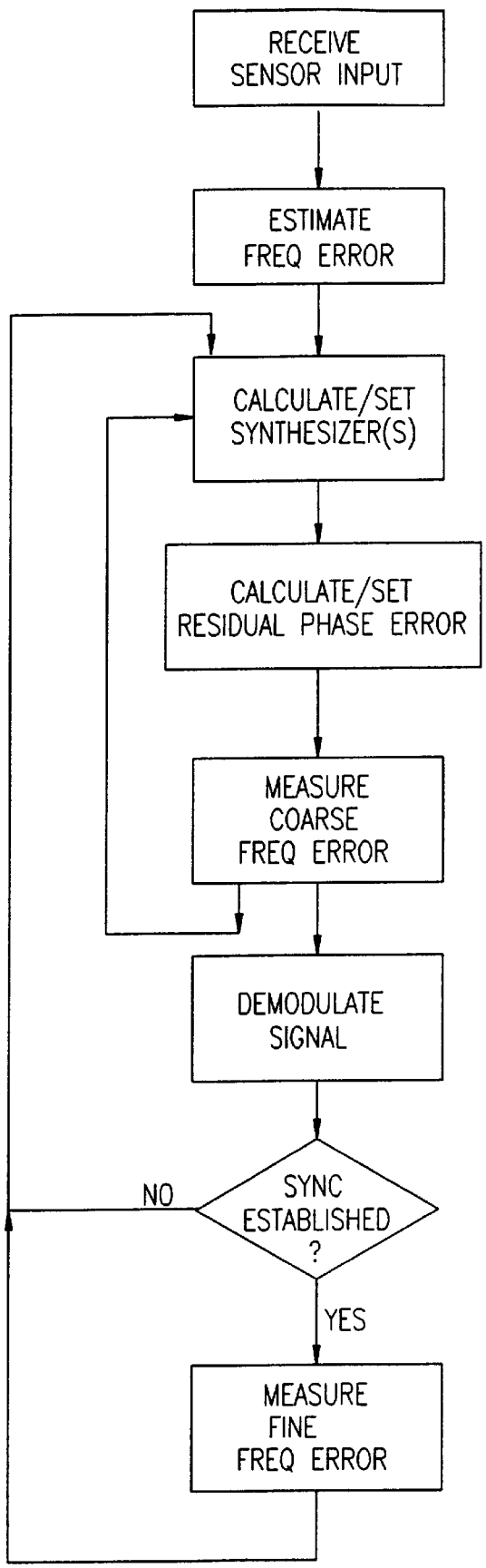
FIG. 4 is a flow chart that schematically illustrates a method of frequency tuning, in accordance with a preferred embodiment of the present invention.

FIG. 4 is a flow chart that schematically illustrates a method for error parsing and frequency correction implemented in transceiver 20, in accordance with a preferred embodiment of the present invention. The frequency is corrected in a number of successive iterations, until a desired precision is reached.

Preferably, processor 22 receives an input from sensor 30, and uses this input together with data stored in memory 37 to calculate an initial estimate of the frequency error by dead reckoning, $\Delta f_1$, without transceiver 20 having yet acquired a signal from the base station. The processor parses the estimated error into corrections to be applied by synthesizer 56, synthesizer 58 and subtractor 41, respectively in the following manner:

Processor 22 first uses the estimated correction to determine a setting $N_1$ provided by setter 28 to synthesizer 56, indicating the number of steps by which the synthesizer must step its frequency output. Preferably, $N_1$=ROUND $(\Delta f_1/St1)$, wherein St1 is the size of the frequency steps performed by the synthesizers, e.g., 25 or 12.5 kHz, as noted in the example described hereinabove.

The chosen value of $N_1$ is used to find a residual, intermediate frequency error $\Delta f_2=\Delta f_1-N_1*St1$. $\Delta f2$ is used in calculating a setting $N_2$ to be input from setter 28 to synthesizer 58, indicating the number of steps by which this synthesizer must step its output. Preferably, $N_2$=ROUND $(\Delta f_2/St2)$, wherein St2 is the step size of synthesizer 58, which is about 1 kHz in the example given above.

Finally, a fine frequency error $\Delta f_3$ is calculated based on the phase deviation detected by detector 42, as described hereinabove. This fine error is preferably given by $\Delta f_3=\Delta f_2-N_2*St2$, and is input to subtractor 41 or as a time-varying phase rotation to complex multiplier 51, as described hereinabove.

Once the initial correction is performed, and the RF signal from the base station is acquired, estimator 26 makes a rough measurement of the frequency of the baseband signal, preferably by counting zero-crossings of the signal.

Although an attempt may be made to demodulate the received signal, it is unlikely that the frequency correction applied at this stage is sufficiently accurate to enable the transceiver to establish synchronization with the signal. Therefore, the rough frequency measurement is made without any particular time synchronization and without consideration of the data carried by the signal. The measurement may thus have some inaccuracy, since it depends on the spectral behavior of the data transmitted by the base station, which is not necessarily spectrally symmetrical around the carrier.

The level of accuracy of the measurement is generally sufficient, however, to make a more accurate, closed-loop determination of the frequency error $\Delta f_1$ than was achieved by dead reckoning. This new value of $\Delta f_1$ is parsed by processor 22 and used to find new values of $N_1$, $N_2$ and $\Delta f_3$, using the parsing method described above.

The frequency correction applied following the rough closed-loop error determination is typically sufficient to allow the transceiver to demodulate the received signal and thereby establish synchronization with the received signal. A fine frequency error is then calculated based on the phase deviation detected by detector 42, as described hereinabove. This fine frequency error is once again parsed by processor 22 and used to recalculate $N_1$, $N_2$ and $\Delta f_3$.

The process of closed-loop error detection, parsing and correction preferably continues for as long as transceiver 20 is tuned in to the base station frequency, thus performing the function of automatic frequency control. Based on the detected frequency error, processor 22 likewise calculates and applies, through setter 28, appropriately parsed correction settings to multiplier 48 and synthesizer 54, as well.

To summarize, the frequency error of crystal oscillator 24 is corrected with respect to the frequency of the signals received from the base station by parsing the error into three parts: a coarse error corrected by stepping synthesizer 56, an intermediate residual error corrected by stepping synthesizer 58 and a fine residual error corrected by subtractor 41. The frequency error with respect to signals transmitted by transceiver 20 is parsed into a coarse error corrected by stepping synthesizer 54 and a fine residual error corrected by multiplier 48. It will be understood, however, that in other transceivers, the frequency error with respect to both the received and transmitted signals may be parsed and corrected in two, three, four or more stages, depending on the functional requirements of the application, in accordance with the principles of the present invention.

It will thus be appreciated that the preferred embodiments described above are cited by way of example, and the full scope of the invention is limited only by the claims.

What is claimed is:

1. A radio communication device, which transmits or receives a signal at a predetermined carrier frequency, comprising:

a reference oscillator, which generates a clock frequency having a clock frequency error relative to a specified frequency thereof;

a processor, which estimates the clock frequency error and parses the error to determine coarse and fine error correction components;

at least one frequency synthesizer, which responsive to the clock frequency and to the coarse error correction component, generates a partially corrected frequency having a residual frequency error, which partially corrected frequency is applied to process the signal; and signal processing circuitry, which applies the fine error correction component to process the signal so as to correct the residual frequency error.

2. A device according to claim 1, wherein the reference oscillator comprises a crystal oscillator which is not a temperature-compensated crystal oscillator.

3. A device according to claim 1, wherein the reference oscillator does not receive a control input for adjustment of the clock frequency.

4. A device according to claim 1, wherein the processor estimates the clock frequency error responsive to a known operating characteristic of the reference oscillator.

5. A device according to claim 4, and comprising a sensor, which makes a measurement of an operating condition of the reference oscillator to which the known operating characteristic is responsive, which measurement is used by the processor in estimating the clock frequency error.

6. A device according to claim 5, wherein the sensor comprises a temperature sensor.

7. A device according to claim 4, wherein the known operating characteristic comprises a variation of the clock frequency with age of the oscillator.

8. A device according to claim 4, and comprising a memory, which stores data indicative of the response of the clock frequency error to the operating characteristic, which data are used by the processor in estimating the clock frequency error.

9. A device according to claim 8, wherein the processor measures the response of the clock frequency error to the operating characteristic and processes the measured response to generate the data stored in the memory.

10. A device according to claim 1, wherein the at least one frequency synthesizer comprises first and second frequency synthesizers, wherein the processor parses the coarse error correction component into a first correction component applied by the first synthesizer and a second correction component applied by the second synthesizer.

11. A device according to claim 10, and comprising a mixer, which mixes the signal with the first partially corrected frequency to generate a first intermediate-frequency signal, which is mixed with the second partially corrected frequency to generate a second intermediate-frequency signal for input to the signal processing circuitry.

12. A device according to claim 1, and comprising a signal detector, which provides, responsive to the signal, an indication of a frequency error remaining after application of one or more of the error correction components.

13. A device according to claim 12, wherein the signal detector comprises a frequency estimator, which counts transitions of the processed signal to determine a frequency estimate thereof.

14. A device according to claim 12, wherein the signal detector comprises a phase detector, which detects a phase shift in the signal processed by the signal processing circuitry.

15. A device according to claim 1, wherein the signal processing circuitry comprises baseband circuitry.

16. A device according to claim 15, wherein the baseband circuitry comprises a subtractor, which subtracts a time-varying phase value from the signal so as to correct the residual frequency error.

17. A device according to claim 1, wherein the signal processing circuitry comprises a complex multiplier, which applies a time-varying phase shift to the signal so as to correct the residual frequency error.

18. A device according to claim 1, wherein the signal processing circuitry compensates for the residual frequency error in the course of processing information carried by the signal.

19. A device according to claim 18, wherein the signal processing circuitry comprises a modulator the settings of which are adjusted by an offset determined responsive to the residual frequency error.

20. A device according to claim 18, wherein the signal processing circuitry comprises a demodulator the settings of which are adjusted by an offset determined responsive to the residual frequency error.

21. A device according to claim 1, wherein the at least one synthesizer comprises a receiver synthesizer and a transmitter synthesizer generating respective partially corrected frequencies, which are respectively applied to process received and transmitted signals.

22. A method for tuning the frequency of a radio communications device so as to correct for a frequency error of a clock frequency generated by a reference oscillator relative to a specified frequency thereof, comprising:
  estimating the clock frequency error;
  parsing the estimated error into a coarse error component and a fine error component;
  responsive to the coarse error component, generating a partially-corrected frequency having a residual frequency error;
  applying the partially-corrected frequency to process the signal; and
  responsive to the fine error component, applying a fine frequency correction so as to correct the residual frequency error wherein estimating the error comprises estimating a frequency deviation responsive to an operating characteristic of the reference oscillator.

23. A method according to claim 22, and comprising making a measurement of an operating condition of the oscillator to which the operating characteristic is responsive, wherein the error is estimated responsive to the measurement.

24. A method according to claim 23, wherein making the measurement comprises measuring a temperature.

25. A method according to claim 22, wherein estimating the error comprises estimating a variation of the clock frequency with age of the oscillator.

26. A method according to claim 22, wherein estimating the frequency deviation comprises recording and using a record of frequency dependence on the operating characteristic.

27. A method for tuning the frequency of a radio communications device so as to correct for a frequency error of a clock frequency generated by a reference oscillator relative to a specified frequency thereof, comprising:
  estimating the clock frequency error;
  parsing the estimated error into a coarse error component and a fine error component;
  responsive to the coarse error component, generating a partially-corrected frequency having a residual frequency error;
  applying the partially-corrected frequency to process the signal; and
  responsive to the fine error component, applying a fine frequency correction so as to correct the residual frequency error wherein parsing the error into the coarse component comprising parsing the error into initial and intermediate error components, and
  wherein generating the partially corrected frequency comprises generating a first partially corrected frequency responsive to the initial error component and a second partially corrected frequency responsive to the intermediate error component, which first and second partially corrected frequencies are applied in processing the signal.

28. A method according to claim 27, wherein applying the partially corrected frequency comprises mixing the signal with the first partially corrected frequency to generate a first intermediate-frequency signal, which is mixed with the second partially corrected frequency to generate a second intermediate-frequency signal.

29. A method for tuning the frequency of a radio communications device so as to correct for a frequency error of a clock frequency generated by a reference oscillator relative to a specified frequency thereof, comprising:
  estimating the clock frequency error;
  parsing the estimated error into a coarse error component and a fine error component;
  responsive to the coarse error component, generating a partially-corrected frequency having a residual frequency error;
  applying the partially-corrected frequency to process the signal; and
  responsive to the fine error component, applying a fine frequency correction so as to correct the residual frequency error, wherein estimating the error comprises determining, responsive to the signal, an estimate of a frequency error remaining after processing the signal and wherein estimating the error comprises determining, responsive to the signal, an estimate of a frequency error remaining after processing the signal.

30. A method according to claim 29, wherein measuring the frequency comprises counting transitions in the signal.

31. A method for tuning the frequency of a radio communications device so as to correct for a frequency error of a clock frequency generated by a reference oscillator relative to a specified frequency thereof, comprising:
  estimating the clock frequency error;
  parsing the estimated error into a coarse error component and a fine error component;
  responsive to the coarse error component, generating a partially-corrected frequency having a residual frequency error;
  applying the partially-corrected frequency to process the signal; and
  responsive to the fine error component, applying a fine frequency correction so as to correct the residual frequency error, wherein estimating the error comprises determining, responsive to the signal, an estimate of a frequency error remaining after processing the signal and wherein estimating the error comprises detecting a frequency deviation in baseband processing of the signal.

32. A method according to claim 31, wherein detecting the frequency deviation comprises acquiring a synchronization of a signal received by the device and detecting a deviation responsive to the synchronization.

33. A method for tuning the frequency of a radio communications device so as to correct for a frequency error of a clock frequency generated by a reference oscillator relative to a specified frequency thereof, comprising:
  estimating the clock frequency error;
  parsing the estimated error into a coarse error component and a fine error component;
  responsive to the coarse error component, generating a partially-corrected frequency having a residual frequency error;
  applying the partially-corrected frequency to process the signal; and
  responsive to the fine error component, applying a fine frequency correction so as to correct the residual frequency error, wherein estimating the error comprises determining, responsive to the signal, an estimate of a frequency error remaining after processing the signal and wherein estimating and parsing the error comprises estimating and parsing iteratively and applying the iteratively estimated and parsed error components so as to compensate for the clock frequency error to within a predetermined tolerance.

34. A method for tuning the frequency of a radio communications device so as to correct for a frequency error of a clock frequency generated by a reference oscillator relative to a specified frequency thereof, comprising:

estimating the clock frequency error;

parsing the estimated error into a coarse error component and a fine error component;

responsive to the coarse error component, generating a partially-corrected frequency having a residual frequency error;

applying the partially-corrected frequency to process the signal; and responsive to the fine error component, applying a fine frequency correction so as to correct the residual frequency error, wherein estimating the error comprises determining, responsive to the signal, an estimate of a frequency error remaining after processing the signal and wherein determining the estimate comprises estimating a frequency error in processing a received signal, and wherein parsing the error comprises parsing the estimated frequency error for application of corrections to a transmitted signal.

35. A method for tuning the frequency of a radio communications device so as to correct for a frequency error of a clock frequency generated by a reference oscillator relative to a specified frequency thereof, comprising:

estimating the clock frequency error;

parsing the estimated error into a coarse error component and a fine error component;

responsive to the coarse error component, generating a partially-corrected frequency having a residual frequency error;

applying the partially-corrected frequency to process the signal; and responsive to the fine error component, applying a fine frequency correction so as to correct the residual frequency error wherein applying the fine frequency a correction comprises applying the correction during baseband processing.

36. A method according to claim 35, wherein applying the fine frequency correction comprises subtracting the frequency correction.

37. A method for tuning the frequency of a radio communications device so as to correct for a frequency error of a clock frequency generated by a reference oscillator relative to a specified frequency thereof, comprising:

estimating the clock frequency error;

parsing the estimated error into a coarse error component and a fine error component;

responsive to the coarse error component, generating a partially-corrected frequency having a residual frequency error;

applying the partially-corrected frequency to process the signal; and responsive to the fine error component, applying a fine frequency correction so as to correct the residual frequency error wherein applying the fine frequency correction comprises applying a time-varying phase shift to the signal.

38. A method according to claim 37, wherein applying the phase shift comprises driving a complex multiplier which operates on the signal.

39. A method for tuning the frequency of a radio communications device so as to correct for a frequency error of a clock frequency generated by a reference oscillator relative to a specified frequency thereof, comprising:

estimating the clock frequency error;

parsing the estimated error into a coarse error component and a fine error component;

responsive to the coarse error component, generating a partially-corrected frequency having a residual frequency error;

applying the partially-corrected frequency to process the signal; and responsive to the fine error component, applying a fine frequency correction so as to correct the residual frequency error wherein applying the fine frequency correction comprises compensating for the residual frequency error in the course of processing information carried by the signal.

* * * * *